United States Patent [19]

Asano

[11] Patent Number: 5,061,322
[45] Date of Patent: Oct. 29, 1991

[54] METHOD OF PRODUCING P-TYPE AMORPHOUS SILICON CARBIDE AND SOLAR CELL INCLUDING SAME

[75] Inventor: Akihiko Asano, Kanagawa, Japan

[73] Assignee: Fuji Electric Corporation Research and Development Ltd., Kanagawa, Japan

[21] Appl. No.: 408,258

[22] Filed: Sep. 18, 1989

[30] Foreign Application Priority Data

Oct. 7, 1988 [JP] Japan .................. 63-253113
Mar. 24, 1989 [JP] Japan .................. 1-72216

[51] Int. Cl.$^5$ .................. H01L 31/072; H01L 31/18
[52] U.S. Cl. .................. 136/258; 357/30; 427/39; 427/74; 437/4; 437/100; 437/101
[58] Field of Search .................. 437/4, 100, 101; 136/258 AM; 357/30 J, 30 K, 2; 427/39, 74

[56] References Cited

U.S. PATENT DOCUMENTS 4,775,425 10/1988 Guha et al. .................. 136/249 TJ
4,847,215 7/1989 Hanaki et al. .................. 437/100
4,910,153 3/1990 Dickson .................. 437/4

OTHER PUBLICATIONS

Tawada, Y. et al., "Properties and Structure of a–SiC:H for High–Efficiency a–Si Solar Cell", Journal of Applied Physics, vol. 52, No. 7, pp. 5273–5281, Jul. 1982.

Primary Examiner—Aaron Weisstuch
Attorney, Agent, or Firm—Finnegan, Henderson, Farabow, Garrett, and Dunner

[57] ABSTRACT

A method of producing a p-type hydrogenated amorphous silicon carbide thin film comprising the steps of preparing a raw material gas mixture consisting of a silicon compound, a hydrocarbon or a fluocarbon, and a boron compound, diluting the raw material gas mixture with hydrogen gas, and decomposing the raw material gas mixture by glow discharge to achieve a resultant film having a prescribed value of photoconductivity with a reduced optical absorption coefficient.

10 Claims, 2 Drawing Sheets

METHOD OF PRODUCING P-TYPE AMORPHOUS SILICON CARBIDE AND SOLAR CELL INCLUDING SAME

BACKGROUND OF THE INVENTION

1. Field of the Invention

The present invention relates to a method of producing p-type amorphous silicon carbide, and more particularly relates to a method for producing boron-doped p-type hydrogenated amorphous silicon carbide (hereinafter referred to as a-SiC:H), which is used as a window layer material for a p-i-n-type amorphous silicon solar cell.

2. Description of the Related Art

Use of a a-SiC:H thin film as a window layer material for a pin-type amorphous silicon solar cell has remarkably contributed to increasing the optoelectric conversion efficiency of the cell.

FIG. 2 illustrates an example of a structure of a conventional amorphous silicon solar cell. On a glass substrate 21, are laminated a tin oxide ($SnO_2$) thin film 22, a p-type a-SiC:H layer 23, an i-type hydrogenated amorphous silicon (hereinafter referred to a-Si:H) layer 24, an n-type a-Si:H layer 25, and an aluminum electrode 26.

The tin oxide thin film 22 of such a conventional cell is formed by vacuum evaporation or thermal CVD, while the aluminum electrode 26 is formed by vacuum evaporation or sputtering. The a-Si:H layer is formed by plasma CVD in which a mono-silane gas ($SiH_4$) is decomposed by glow discharge at a substrate temperature of about 250° C.

In the formation of the n type a Si:H layer 25, phosphine gas ($PH_3$) is mixed with the mono-silane gas at a flow rate ratio of about 1% to the mono-silane gas. In the formation of the p-type a-SiC:H layer 23, methane gas ($CH_4$) and diborane gas ($B_2H_6$) are mixed with the mono-silane gas.

When light 27 is made incident onto the glass substrate 21 of such an amorphous silicon solar cell as described above, a positive electric potential is generated in the p-side tin oxide electrode 22 and a negative electric potential is generated in the n-side aluminum electrode 26, respectively, by the photovoltaic effect in the p-i-n junction. FIG. 3 shows the current-voltage characteristics of the solar cell under sun light having intensity of 100 mW/cm$^2$. This presented by Tawada et al. in the *Journal of Applied Physics*, Vol. 53 (1982), pp. 5273–5281. The black dot represents the point at which a product of the output current density and the output voltage, the output electric power per square centimeter of the amorphous silicon solar cell, becomes maximum. The output power at this point is generally called the output of the amorphous silicon solar cell, and the ratio of the output electric power to the incident light power is called the conversion efficiency.

In order to increase the output power of such an amorphous silicon solar cell, it is important that the light transmissivity of the p-type layer is high so that as much light as is possible can reach the i-type layer because only the i-type layer is photovoltaically active. Therefore, it is necessary to reduce the optical absorption coefficient of the p-type layer. The optical absorption coefficient $\alpha$ of the p-type layer is calculated from the following expression (1) in terms of its band gap Eg (unit:electron volt):

$$\alpha = B^2 (E-Eg)^2/E \quad (E<Eg) \quad (1)$$

In the above expression (1), $B^2$ represents a constant, and E represents photon energy measured in electron volts. From the expression (1), it is understood that increasing Eg reduces the absorption coefficient u. In the journal mentioned above, Tawada et al. report that the conversion efficiency of an amorphous solar cell is improved from 5-6% to about 8% by forming the p-type layer with an a-SiC:H which has a wider band gap than an a-Si:H.

As described above, the transmissivity of the p-type layer increases with an increase in band gap. However, its electric conductivity under light irradiation (photoconductivity) decreases as the band gap increases. FIG. 4 shows the dependence of the photoconductivity of an a SiC:H film on its band gap, which dependence is plotted from the results reported in the foregoing journal article by Tawada et al. Such decrease in the photoconductivity will result in increasing the series resistance of the solar cell. Generally, the thickness of the p-type layer is about $10^{-6}$ cm (10 nm) and its photoconductivity is $10^{-6}$ S/cm. This value of photoconductivity is the minimum permissible because the value corresponds to a series resistance component of 1 $\Omega$ for an amorphous silicon solar cell having an area of 1 square centimeter and the series resistance larger than 1 $\Omega$ is not desirable for the cell. FIG. 4 suggests that the band gap must be under 2.0 electron volts in order to obtain a photoconductivity larger than $10^{-6}$ S/cm. Consequently, it is difficult to provide a p-type window layer, material for a p-i-n type amorphous silicon solar cell using an a-SiC:H film which has a band gap of 2.0 electron volts or more for improved light transmittivity as well as a photoconductivity of $10^{-6}$ S/cm or more.

SUMMARY OF THE INVENTION

It is accordingly an object of the present invention to solve the foregoing problems associated with the related art and, specifically, to provide a method of producing a p-type a SiC:H thin film which has a higher photo conductivity as well as a larger band gap than a p-type a-SiC:H film produced by the conventional method, and which is capable of improving the conversion efficiency of an amorphous silicon solar cell as its window layer material.

Additional objects and advantages of the invention will be set forth in the description which follows.

To achieve the foregoing objects, and in accordance with the purposes of the invention as embodied and broadly described herein, a method of producing a p-type a-SiC:H film is provided comprising a step of preparing a raw material gas mixture composed of a silicon compound, a hydrocarbon or a fluorocarbon and a boron compound, the mixture being diluted with gas, and a step whereby such a raw material gas mixture is decomposed by glow discharge, wherein the flow rate of the hydrogen gas is selected to be 100 times or more than that of the silicon compound, and wherein a boron fluoride compound is used as the boron compound.

A boron fluoride series radical $B_{m-x} F_{n-y}$ (m, n, x, and y being natural numbers, and $x<m$ and $y<n$) produced by decomposition of a boron fluoride compound, having a formula of $B_m F_n$, by glow discharge, has lower reactivity with hydrogen than a boron hydride radical such as $BH_3$ or $B_2H_5$ which are produced from diborane. Therefore, the boron fluoride radicals remove less hydrogen atoms covering the growing surface of an a SiC:H film. Consequently, the hydrogen atom density on the film growing surface is kept high by increasing the dilution ratio of the raw material gas with hydrogen to 100 times or more. As a result, the number of defects generated during growth of the a-SiC:H film is reduced, thereby improving the photoconductivity of the a-SiC:H film.

BRIEF DESCRIPTION OF THE DRAWINGS

The accompanying drawings illustrate the presently preferred embodiments and method of the invention. In the drawings.

DETAILED DESCRIPTION OF THE INVENTION

Reference will now be made in detail to the presently preferred embodiment and method of the invention as illustrated in the accompanying drawings.

Figure 1:
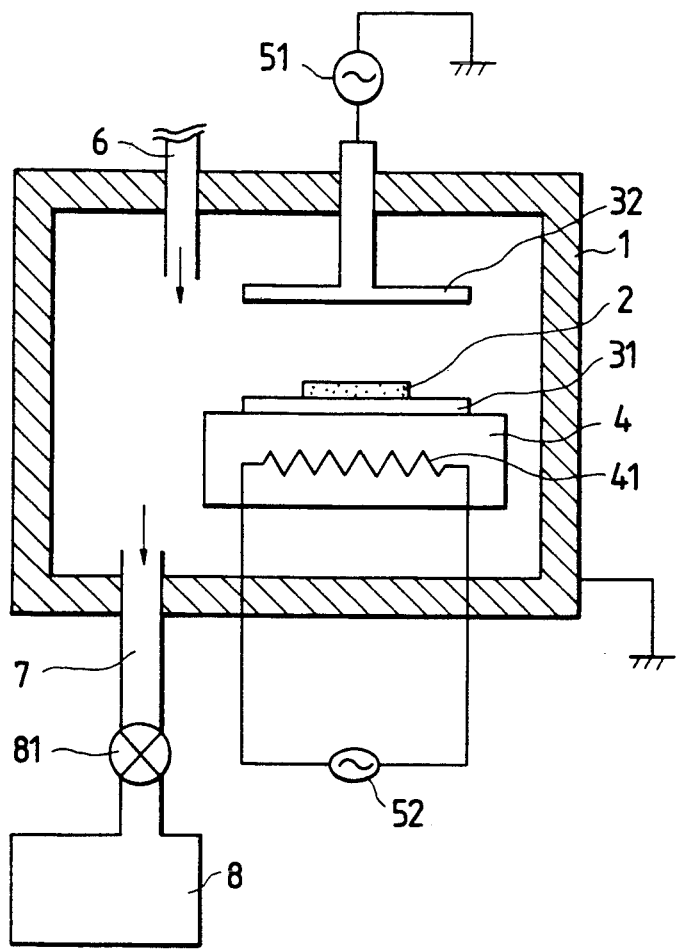
FIG. 1 illustrates a cross section of a plasma CVD apparatus used in an example of the present invention.
Figure 2:
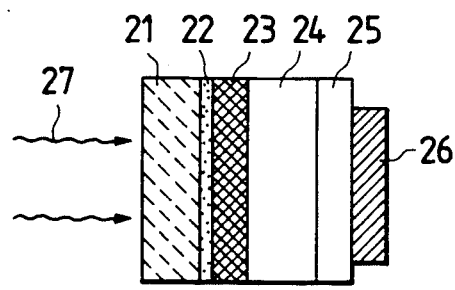
FIG. 2 illustrates a cross section of a conventional amorphous solar cell using a p-type a-SiC:H film.
Figure 3:
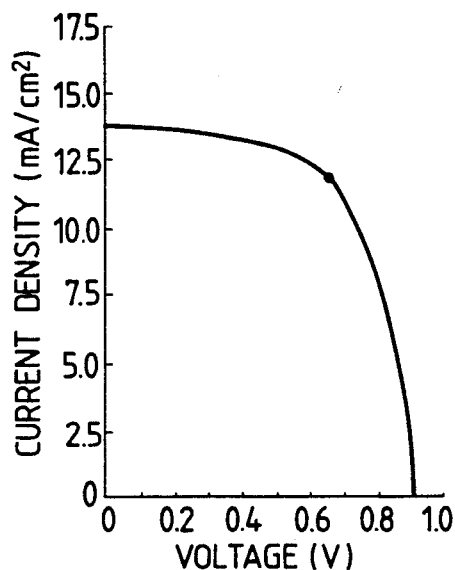
FIG. 3 illustrates a current-voltage characteristic of the solar cell of FIG. 2.

FIG. 1 illustrates a plasma CVD apparatus to be used in an example of the present invention. In a vacuum chamber 1, having an internal volume of 10 liters, a lower circular electrode 31 for supporting a substrate 2 is mounted on a heating mount 4 opposite to an upper circular electrode 32. The area of each electrode 31 and 32 is 150 cm$^2$. The upper electrode 32 is connected to a high frequency power source 51, and a heater 41, provided in the heating mount 4, is connected to a power source 52. A gas inlet pipe 6 and an outlet pipe 7 are opened to the vacuum cell 1, and the discharge pipe 7 is connected to a vacuum pump 8 through a control valve 81.

A example of the present invention using the above-mentioned apparatus is as follows.

As a raw material gas, mono-silane, methane, diboron tetrafluoride ($B_2F_4$), and hydrogen were used. The flow rate of the mono-silane was 1.0 cc/min., the flow rate of the methane was 4.0 cc/min., the flow rate of the $B_2F_4$ was 0.1 cc/min., and the flow rate of the hydrogen was 200 cc/min. so that the dilution ratio of the monosilane gas with hydrogen was 200. The raw material gas was fed into the evacuated cell through the gas inlet pipe 6. The rate of evacuation was adjusted by the control valve 81 so that the raw material gas pressure in the vacuum chamber 1 became 100 Pa. The heater 41 was then turned on so that the temperature of the glass substrate 2 became 250° C. Next, high frequency electric power of 2 watts and frequency of 13.56 MHz was applied by the high frequency power source 51 to the circular electrode 32 thereby generating glow discharge across the circular electrodes 31 and 32. As a result, the raw material gas decomposed forming a p-type a-SiC:H thin film on the glass substrate. The deposition rate of film formation was 0.1 Å/sec.

Figure 4:
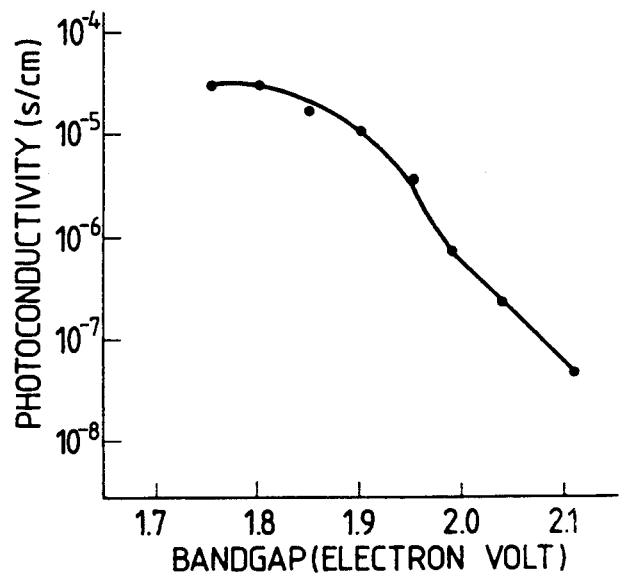
FIG. 4 illustrates the relationship between the photoconductivity and band gap of a p-type a SiC:H film.

The band gap and photoconductivity of the deposited p-type a-SiC:H film were 2.1 electron volts and $10^{-5}$ S/cm, respectively. It was also found that the photoconductivity of the p-type a-SiC:H film produced in this example was higher by about 2 orders of magnitude than the photoconductivity of a conventionally deposited film shown in FIG. 4.

Figure 5:
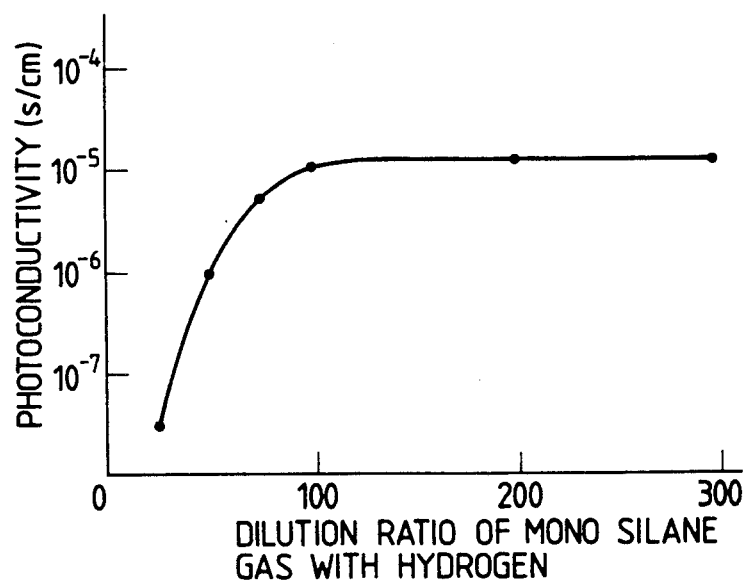
FIG. 5 illustrates the relationship between the photoconductivity of a p type a-SiC:H film and the dilution ratio of the raw material gas with hydrogen in deposition of the p-type a-SiC:H film.

FIG. 5 illustrate the photoconductivity of a p-type a-SiC:H film which was produced under conditions such the temperature of the glass substrate was fixed at 250° C., and the dilution of the mono-silane gas with hydrogen was varied. In this case, the dilution ratio of the raw material gas with hydrogen was varied in such a manner that the flow rates of mono-silane, methane, and boron trifluoride were fixed to respective constant rates of 1.0 cc/min., 4.0 cc/min., and 0.3 cc/min., and the flow rate of hydrogen was changed between a range of 25 cc/min. and 300 cc/min. As seen in FIG. 5, when the dilution ratio of mono-silane with hydrogen was less than 100, the photoconductivity increased as the hydrogen dilution ratio increased. When the dilution ratio of mono-silane with hydrogen was 100 or more, the photoconductivity hardly depended on the hydrogen dilution ratio. The band gap of the film also hardly depended on the hydrogen dilution ratio, and the value was 2.1 electron volts. From the foregoing results, it was found that, to make the photoconductivity of a p-type a-SiC:H film be $10^{-5}$ S/cm or more, it is necessary to make the dilution ratio of the silicon compound, such as the mono-silane gas, or the like, with hydrogen, be 100 or more.

Although diboron tetrafluoride was used as the boron fluoride series compound in the foregoing example, the same effect as described above can be obtained even when a compound, such as boron trifluoride ($BF_3$), which generates a boron fluoride radical by glow discharge decomposition, is used in place of diboron tetrafluoride. Further, one can expect to obtain the same effect as described above when a compound in which a portion of fluoride in the foregoing boron fluoride compound is substituted with hydrogen or an organic radical such as a methyl radical, an ethyl radical, a vinyl radical, or the like.

As the silicon compound, di-silane tetrafluoride may be used in place of mono silane. In addition, a fluocarbon may be used in place of a hydrocarbon. Finally, as the hydrocarbon, ethane or acetylene may be used in place of methane, and as the fluocarbon, carbon tetrafluoride or methyl trifluoride can be used.

As described above, the dilution ratio of the silane series gas with hydrogen is selected to be 100 or more, and the boron fluoride series compound, having a bond between boron and fluorine, is used as the doping impurity source for formation of a p-type a-SiC:H film by the plasma CVD method. By this method, the photoconductivity of the p-type, a-SiC:H film can be increased to $10^{-6}$ S/cm or more, even through the band gap of the film is increased to 2.1 electron volts or more in order to reduce the optical absorption coefficient as a window layer material. The resulting p-type a-SiC:H film thus has an unincreased series resistance value and a reduced optical absorption coefficient, which enables an amorphous silicon solar cell with excellent photoelectric conversion efficiency to be obtained.

What is claimed is:

1. A method of producing a hydrogenated p-type amorphous silicon carbide thin film, comprising the steps of:
    preparing a raw material gas mixture consisting of a silicon compound, a hydrocarbon, and a boron fluoride compound;

diluting said raw material gas mixture with hydrogen gas such that the ratio of said hydrogen gas to said silicon compound is at least 100:1; and decomposing said raw material gas mixture by glow discharge to achieve a resultant amorphous silicon carbide thin film having a prescribe value of photoconductivity.

2. A method according to claim 1, wherein said boron fluoride compound provides a boron fluoride series radical $B_{m-x}F_{n-y}$ (m, n, x, and y being natural numbers, and x<m and y<n) produced by glow discharge decomposition of a boron fluoride compound having a formula of $B_mF_n$.

3. A method according to claim 2, wherein said boron fluoride compound is boron trifluoride.

4. A method according to claim 2, wherein said boron fluoride compound is diboron tetrafluoride.

5. A method according to claim 3, wherein a portion of the fluoride in said boron fluoride compound is substituted with hydrogen or an organic radical.

6. A method according to claim 5, wherein said organic radical is a methyl radical, an ethyl radical, or a vinyl radical.

7. A method according to claim 1, wherein said silicon compound is di-silane, silane tetrafluoride, or mono-silane.

8. A method according to claim 1, wherein said hydrocarbon is methane, ethane, or acetylene.

9. A method according to claim 1, wherein the dilution ratio of said silicon compound with said hydrogen is greater than 100.

10. A pin-type amorphous silicon solar battery comprising:
a glass substrate;
a tin oxide layer formed on said glass substrate;
a boron-doped p-type hydrogenated amorphous silicon carbide thin film formed on said tin oxide layer, wherein said boron-doped p-type hydrogenated amorphous silicon carbide thin film is produced by a method comprising the steps of
preparing a raw material gas mixture consisting of a silicon compound, a hydrocarbon, and a boron fluoride compound,
diluting said raw material gas mixture with hydrogen gas such that the ratio of said hydrogen gas to said silicon compound is at least 100:1, and
decomposing said raw material gas mixture by glow discharge to achieve a resultant amorphous silicon carbide thin film having a prescribed value of photoconductivity;
an i-type amorphous silicon hydride layer formed on said boron-doped p-type hydrogenated amorphous silicon carbide thin film;
an n-type amorphous silicon hydride layer formed on said i-type amorphous silicon hydride layer; and
an aluminum electrode formed on said n-type amorphous silicon hydride layer.

* * * * *